United States Patent [19]

Machuga et al.

[11] Patent Number: 5,137,846

[45] Date of Patent: Aug. 11, 1992

[54] METHOD FOR FORMING A POLYCYANURATE ENCAPSULANT

[75] Inventors: Steven C. Machuga, Schaumburg, Ill.; Robert W. Pennisi, Boca Raton, Fla.; Stephanie Schauer, Rolling Meadows, Ill.

[73] Assignee: Motorola, Inc., Schaumburg, Ill.

[21] Appl. No.: 648,064

[22] Filed: Jan. 31, 1991

[51] Int. Cl.$^5$ .............................................. H01L 21/56
[52] U.S. Cl. .................................... 437/211; 437/225; 437/207; 437/213
[58] Field of Search ............... 437/211, 207, 213, 225, 437/209

[56] References Cited

U.S. PATENT DOCUMENTS 4,709,008 11/1987 Shimp ................................. 528/422
4,999,699 3/1991 Christie et al. ........................ 357/65

OTHER PUBLICATIONS

Shimp, D. A. et al., "New Liquid Dicyanate Monomer for Rapid Impregnation of Reinforcing Fibers"presented at 34th International SAMPE Symposium, Reno, May 8–11, 1989.
Shimp, D. A. et al., "New Cyanate Ester Rsin With Low Temperature (125°–200° C.) Cure Capability" presented at 35th International SAMPE Symposium and Exhibition, Apr. 2–5, 1990, Anaheim, California.

Primary Examiner—Brian E. Hearn
Assistant Examiner—Trung Dang
Attorney, Agent, or Firm—Douglas D. Fekete

[57] ABSTRACT

An improved encapsulant for an electronic component package is composed of an inorganic powder dispersed in a polycyanurate resin binder. The encapsulant is formed by applying a curing mixture of the powder and a liquid vehicle composed predominantly of a blend of one or more multifunctional cyanate ester compounds that are curable to form the binder. The blend includes a cyanate ester substituted bisphenol derivative compound having the formula

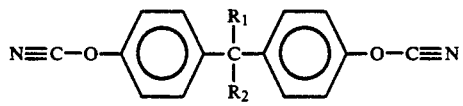

wherein $R_1$ and $R_2$ are members of the group consisting of hydrogen, methyl and ethyl. Preferably, the blend includes a second cyantophenylene compound having the formula

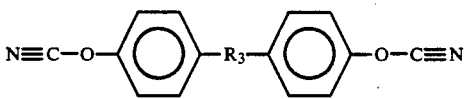

wherein $R_3$ is a hydrocarbon chain including an aryl link.

16 Claims, No Drawings

METHOD FOR FORMING A POLYCYANURATE ENCAPSULANT

BACKGROUND OF THE INVENTION

This invention relates to a protective encapsulant applied to an electronic component package, and, more particularly, to an encapsulant comprising a powdered inorganic filler dispersed in a polycyanurate resin binder formed from a cyanate ester-substituted bisphenol derivative compound.

A typical electronic component package comprises an integrated circuit die formed of a semiconductor silicon chip and mounted onto a printed circuit board or other suitable substrate. Fine metal wire leads are bonded to terminals on the die and on the substrate to interconnect the circuits. The component and the delicate leads are protected by a coating, referred to as an encapsulant or "glob top", which is formed of a powdered inorganic filler dispersed in a polymer resin binder.

Alternately, a component may be mounted onto a substrate by an array of solder bump interconnections that bond terminal pads on the surface of the component to corresponding terminal pads on a facing region of the substrate to attach the component and to connect the circuits. In this package, the component is spaced apart from the substrate by the interconnections. The gap between the component and the substrate and about the interconnections is filled by an encapsulant to reinforce the attachment and to protect the interconnections from corrosion.

Conventional encapsulant compositions have a high content of inorganic powder, typically greater than about 60 weight percent, to provide a coefficient of thermal expansion and other properties compatible with the electronic package materials. For application, the powder is dispersed in a curable liquid vehicle that includes the precursor compounds for forming the binder phase. The mixture is applied to the package and heated to polymerize the binder and thereby complete the encapsulant. Thus, for the encapsulant, a vehicle is selected having a suitably low viscosity to produce a flowable mixture, despite the high solids content, that may be readily dispensed onto the package, preferably at ambient temperature. Further, the binder needs to be curable at a temperature sufficiently low to avoid damage to the package. Common binders are based upon epoxy resins cured with acid anhydride. Such epoxy-base resins tend to absorb moisture and also to contain halide impurities. This combination accelerates corrosion of the leads or interconnections, as well as other metal features of the package. It has been proposed to utilize silicone resins to reduce corrosion, but such resins do not provide adequate mechanical reinforcement.

This invention contemplates an encapsulant for an electronic component package that is formed by applying and curing a mixture of inorganic powder dispersed in a liquid vehicle composed mainly of cyanate ester compounds curable to form a polycyanurate resin binder. The vehicle includes at least one bisphenol-derivative multifunctional cyanate ester compound suitable for formulating a low viscosity liquid that may be blended with a high proportion of solid powder to form a mixture that is dispensable at ambient or near-ambient temperature, yet is curable at a temperature suitably low to avoid damage to the package. The product encapsulant exhibits an enchanted combination of corrosion resistance and mechanical properties, particularly in comparison to conventional epoxy-base encapsulant compositions.

SUMMARY OF THE INVENTION

In accordance with a preferred embodiment of this invention, a high-solids, corrosion-resistant encapsulant composed of an inorganic powder dispersed in a substantially halide-free, hydrophobic polycyanurate resin binder is formed by applying and curing a mixture of the powder and a curable liquid vehicle composed predominantly of a blend of one or more cyanate ester compounds that are reactable to produce the binder. The blend comprises a low molecular weight, multifunctional cyanatophenylene compound having the formula

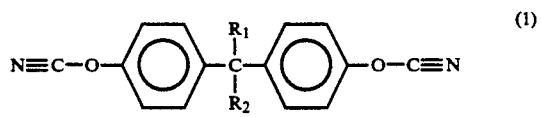

wherein $R_1$ and $R_2$ are members of a group consisting of hydrogen, methyl and ethyl groups. A preferred compound is a cyanate ester-substituted bisphenol derivative wherein $R_1$ and $R_2$ are distinct groups. The preferred compound is a liquid at ambient or near-ambient temperatures and is miscible with other cyanate ester compounds to produce a low viscosity solution suitable for forming a basis for the vehicle. Depending upon the particular cyanate ester compounds selected for the vehicle, it is believed that blends containing as little as 30 weight percent formula 1 compound are adequate to form a liquid vehicle suitable for accepting a high proportion of solid powder from the desired dispensable mixture.

In one aspect of this invention, the vehicle is composed of a blend of cyanate ester compounds that includes, in addition to a bisphenol derivative having formula 1, a second bis(cyanatophenylene) compound having the formula

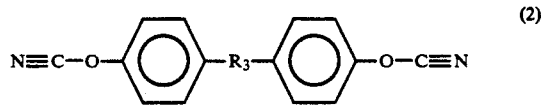

wherein $R_3$ is a hydrocarbon linkage that includes one or more additional aryl links. The second compound thus contains terminal cyanate ester groups that react with the cyanate ester groups of the formula 1 monomer to become incorporated into the binder resin. It is believed that the incorporation of the formula 2 monomer increases the proportion of hydrocarbon to enhance the hydrophobic properties of the binder and thereby further improve corrosion protection. A formula 2 monomer need not be liquid in undiluted condition, but may be a semisolid that forms a liquid vehicle when suitably diluted with sufficient formula 1 monomer. A preferred blend of formula 1 and formula 2 cyanate esters comprises between about 40 and 60 parts by weight formula 1 monomer and forms a flowable liquid at ambient temperature.

The vehicle also preferably includes a hydrogen source, such as a high boiling point alcohol, and an organic metallic coordination complex containing a transition metal catalyst, to facilitate polymerization reactions. The vehicle may include additional agents, including up to 10 weight percent epoxy compound, to enhance fracture toughness or other properties of the product resin.

In accordance with this invention, the vehicle is prepared and mixed with an inorganic powder to form a dispensable mixture. Suitable fillers include powders of oxide materials such as silica, alumina or aluminosilicate, as well as non-oxides such as aluminum nitride. The mixture may contain greater than 60 weight percent solids, i.e., filler powder, with the balance being liquid vehicle, so as to produce a cured encapsulant having a coefficient of thermal expansion between about 18 and 35 ppm per ° C. to approximately match the expansion and contraction of the component and the substrate during temperature fluctuations of the type typically experienced by the package during operation. A preferred mixture contains between 60 and 70 weight percent solids. The mixture is applied at ambient temperature to the package and heated to a temperature sufficient to react the cyanate ester groups to form a polycyanurate polymer.

The encapsulant produced in accordance with this invention forms a self-sustaining body that tightly bonds to the package surfaces and resists mechanical deformation to protect the underlying component features, including wire leads or solder bump interconnections. The cyanate ester constituents for the binder are readily commercially available in high purity grade substantially free of halide contamination. Furthermore, the polycyanurate matrix displays low moisture absorptivity. As a result, the encapsulant of this invention reduces corrosion of the enclosed package features, particularly in comparison to halide-contaminated epoxy resin encapsulants.

DETAILED DESCRIPTION OF THE INVENTION

The preferred embodiments of this invention are illustrated by the following examples, wherein parts are based upon weight.

EXAMPLE 1

In this example, an encapsulant was formed in accordance with this invention by applying and curing a mixture having the following formulation:

| | |
|---|---|
| 40 | parts cyanate ester 1 |
| 60 | parts cyanate ester 2 |
| 4 | parts p-nonylphenol |
| 0.1 | part zinc neodecanoate |
| 220 | parts fused silica powder |

Cyanate ester 1 was 1,1-bis(4-cyanatophenylene) ethane compound obtained commercially from Hi-Tek Polymers, Inc., Louisville, Ky., under the trade designations AroCy L-10, and having the formula:

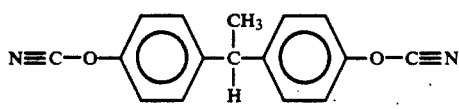

The compound was derived from a bisphenol compound by substitution of cyanate ester groups for hydroxyl groups and has a formula in accordance with formula 1 wherein $R_1$ and $R_2$ are hydrogen and methyl group, respectively. Cyanate ester 2 is 1,3-bis(2-(p-cyanatophenyl)benzene compound commercially obtained from Hi-Tek Polymers, Inc., under the trade designation RTX-366 and having the formula:

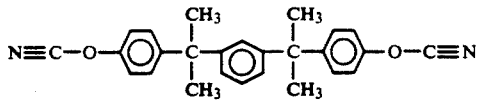

Prior to adding the silica powder, a liquid vehicle was prepared by blending the cyanate ester compounds, phenol compound and the zinc compound to obtain a low viscosity, opaque liquid at ambient temperature. The silica powder was added to the liquid vehicle to form a flowable mixture. The resulting mixture contained about 68 weight percent inorganic solid. The mixture was readily dispensed at ambient temperature from a syringe-like injection device onto an electronic package substrate and heated at about 150° C. for about three hours to react the cyanate ester compounds to form a polycyanurate binder. The product encapsulant was a solid body composed of the silica powder dispersed in a polycyanurate binder. The binder exhibits low moisture absorption and a halide content of less than 5 ppm, attributed mainly to the low halide content of the commercial monomers. As a result, the encapsulant was well suited for protecting an electronic component package.

EXAMPLE 2

An encapsulant was formed in accordance with this invention by applying to an electronic package substrate and curing a mixture having the following formulation:

| | |
|---|---|
| 50 | parts cyanate ester 1 |
| 50 | parts cyanate ester 2 |
| 3 | parts metacresol |
| 0.1 | part zinc naphthanate |
| 5 | parts partially epoxidized polybutene |
| 220 | parts fused silica powder |

The cyanate ester monomers were similar to Example 1, except that the cyanate ester 2 was prepolymerized to react with about 25 percent of the ester groups. The epoxidized polybutene was obtained commercially from Amoco Chemical Company under the trade designation Actipol E6. Prior to adding the silica powder, the monomers were blended with the metacresol, zinc compound and the polybutene compound to form a low viscosity vehicle. The vehicle was then blended with the silica powder to form a mixture that was dispensed at ambient temperature from a injector onto the substrate. The mixture was cured by heating at 150° C. for three hours. The resulting encapsulant was a solid body composed of the silica binder dispersed in a polycyanurate binder and was deemed particularly well suited for protecting a component of an electronic component package. In comparison to the encapsulant formed in Example 1, the encapsulant exhibited improved fracture toughness, which was attributed mainly to the polybutene addition.

EXAMPLE 3

In accordance with another example of this invention, a homopolymer encapsulant was produced from a mixture having the following formulation:

```
100  parts cyanate ester 1
  3  parts p-nonylphenol
0.1  part zinc napthanate
  4  parts partially epoxidized polybutene
220  parts alumino silicate powder
```

The mixture was formed by adding the nonylphenol, the zinc compound and the polybutene compound to the cyanate ester compound to form a vehicle and thereafter adding the powder to the vehicle. The resulting mixture was a low viscosity fluid suitable for dispensing at from an injector onto an electronic package and was cured at 150° C. for about three hours to produce a solid encapsulant. The product encapsulant exhibited low moisture absorptivity and low halide contamination, and was suitable for providing corrosion protection of the underlying package.

Thus, this invention produces an encapsulant on an electronic component package that is formed of an inorganic powder bonded in a polycyanurate matrix. The binder matrix is formed from a blend of one or more multifunctional cyanatophenylene compounds that includes a bisphenol derivative having formula 1. The preferred bisphenol-derivative monomer is miscible with other multifunctional cyanate ester compounds, including other cyanatophenylene compounds such as in Examples 1 and 2. Thus, the formula 1 monomer may be combined in the vehicle with one or more other cyanate ester compounds to produce a product binder resin having optimum properties for a particular electronic package application. The preferred bisphenol derivative is a liquid at ambient temperature. This is attributed to the relatively low molecular weight of the preferred monomer and to the asymmetrical central alkyl linkage that inhibits crystalization. In general, it is believed that vehicles containing as little as 30 weight percent, based upon the total weight of the cyanate ester compounds, of the preferred formula 1 monomer are suitable for forming dispensable mixtures. Preferably, the vehicle contains between 40 and 60 percent formula 1 monomer. Although the preferred vehicle is a liquid at ambient temperature, this invention may be suitably carried out using a vehicle that is non-liquid at room temperature, but that forms a liquid when warmed to permit convenient dispensing under typical electronic component manufacturing conditions.

Following application of the mixture onto the package, the binder resin is cured by heating to a temperature sufficient to react the terminal cyanate ester groups to form triazine rings that cross-link the polycyanurate polymer. In general, a higher curing temperature is desired to minimize the time required to set the binder. However, temperatures greater than about 160° C. tend to damage typical electronic package materials. A preferred range is between about 120° C. and 150° C. The vehicle is cured for a time sufficient to produce a binder having a glass transition temperature of 140° C. or more. Such high transition temperature is desired to maintain substantially uniform properties within the encapsulant despite temperature increases normally encountered by the electronic package during operation. Curing times on the order of three hours are generally sufficient, depending on catalyst content and cure temperature. Longer times may be desired to assure substantially complete polymerization.

Curing is facilitated by a hydrogen source and an organometallic catalyst added to the vehicle. A preferred hydrogen source is an alcohol having a boiling point greater than about 200° C. to minimize vaporization during polymerization. Preferred alcohols include nonylphenol and metacresol and are added in an amount between about 2 and 6 weight percent of the vehicle. Additions of transition metal catalysts promote trimerization reactions by assisting in monomer orientation. Suitable catalysts include zinc, manganese, copper and cobalt and are added in the form of an organometallic complex, for example, with naphthenate, octoate or decanoate, to enhance dissolution in the cyanate ester-base vehicle. It is desired to minimize the catalyst addition to the mixture. Additions of less than 500 ppm metal are generally effective to accelerate the desired polymerization reactions.

The vehicle may also contain agents for modifying the properties of the product resin. The epoxy resins may be optionally added to reduce brittleness of the polycyanurate polymer. It is generally desired to minimize the addition of the epoxy to less than 10% in order to avoid the unwanted halide contaminant. Particulate silicone, castor oil, hydrolyzed fatty acids, alpha-olefin and polybutadiene may also be optionally added as toughening agents. In addition, the vehicle may include a flame retardant material such as an antimony compound or a brominated resin.

While this invention has been described in terms of certain specific embodiments thereof, it will be appreciated that other forms could readily be adapted by those skilled in the art, and, accordingly, the scope of this invention is to considered and limited only by the following claims.

The Embodiments of the Invention in which an exclusive property or privilege is claimed are defined as follows:

1. A method for forming a corrosion-resistant encapsulant on an electronic component package, said method comprising dispensing onto the package at ambient temperature a flowable moisture comprising an inorganic powder and a curable, substantially halide-free liquid vehicle predominantly composed of a cyanate ester blend comprising at least 30 weight percent of a cyanate ester-substituted bisphenol derivative compound having the formula

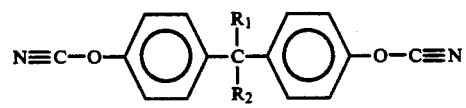

wherein $R_1$ and $R_2$ are distinct members of the group consisting of hydrogen, methyl and ethyl group, and the balance mainly a aryl-linked multifunctional cyanatophenylene compound having the formula

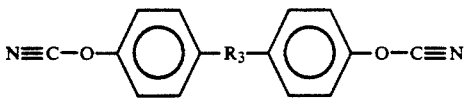

is wherein $R_3$ is a hydrocarbon linkage comprising at least one aryl link, and heating the applied mixture to cure the vehicle and thereby form an encapsulant characterized by the inorganic powder dispersed in a hydrophobic polycyanurate resin binder.

2. A method in accordance with claim 1 wherein the vehicle further comprises a high boiling alcohol and a transition metal catalyst compound.

3. A method in accordance with claim 2 wherein the vehicle includes an alcohol having a boiling point greater than about 200° C. and an organometallic catalyst compound containing a metal selected from the group consisting of zinc, manganese, copper and cobalt.

4. A method in accordance with claim 1 wherein the inorganic powder is formed of an oxide material selected from the group consisting of silica, alumina and aluminosilicate.

5. A method in accordance with claim 1 wherein the mixture comprises at least 60 weight percent inorganic powder.

6. A method in accordance with claim 1 wherein the mixture comprises between about 60 and 70 weight percent inorganic powder.

7. A method in accordance with claim 1 wherein the mixture is heated for curing at a temperature not greater than 160° C.

8. A method in accordance with claim 1 wherein the mixture is cured by heating at a temperature between than 120° C. and 150° C.

9. A method for forming an encapsulant on an electronic component package, said method comprising dispensing onto the package a flowable mixture comprising an inorganic powder and a curable, liquid vehicle composed of a cyanate ester blend comprising a cyanate ester-substituted bisphenol derivative compound having the formula

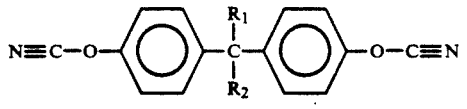

wherein $R_1$ and $R_2$ are members of the group consisting of hydrogen, methyl and ethyl group, and the balance mainly a aryl-linked cyanatophenylene compound having the formula

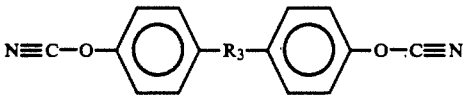

is wherein $R_3$ is a hydrocarbon linkage comprising at least one aryl link, and heating the applied mixture to cure the vehicle and thereby form an encapsulant characterized by the inorganic powder dispersed in a hydrophobic polycyanurate resin binder.

10. A method for forming a corrosion-resistant encapsulant on an electronic component package, said method comprising dispensing onto the package at ambient temperature a flowable moisture comprising an inorganic powder and a curable, substantially halide-free liquid vehicle predominantly composed of a cyanate ester blend consisting essentially of between 40 and 60 weight percent of a (bis)cyanatophenylene) compound having the formula

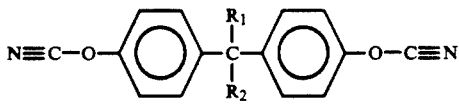

wherein $R_1$ and $R_2$ are distinct members of the group consisting of hydrogen, methyl and ethyl group, and the balance mainly a aryl-linked (bis)-cyanatophenylene) compound having the formula

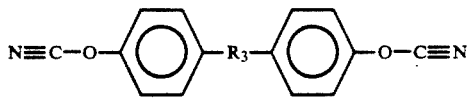

is wherein $R_3$ is a hydrocarbon linkage comprising at least one aryl link, and heating the applied mixture to cure the vehicle and thereby form an encapsulant characterized by the inorganic powder dispersed in a hydrophobic polycyanurate resin binder.

11. A method in accordance with claim 10 wherein the vehicle further comprises a high boiling alcohol and a transition metal catalyst compound.

12. A method in accordance with claim 10 wherein the vehicle includes an alcohol having a boiling point greater than about 200° C. and an organometallic catalyst compound containing a metal selected from the group consisting of zinc, manganese, copper and cobalt.

13. A method in accordance with claim 10 wherein the mixture comprises at least 60 weight percent inorganic powder selected from the group consisting of silica, alumina and aluminosilicate powders.

14. A method in accordance with claim 13 wherein the mixture comprises between about 60 and 70 weight percent inorganic powder.

15. A method in accordance with claim 10 wherein the mixture is heated for curing at a temperature not greater than 160° C.

16. A method in accordance with claim 10 wherein the mixture is cured by heating at a temperature between than 120° C. and 150° C.

* * * * *

UNITED STATES PATENT AND TRADEMARK OFFICE
CERTIFICATE OF CORRECTION

PATENT NO. : 5,137,846
DATED : August 11, 1992
INVENTOR(S) : Steven Machuga, et. al.

It is certified that error appears in the above-indentified patent and that said Letters Patent is hereby corrected as shown below:

Col. 6, line 49, delete -- at ambient temperature --

Col. 6, line 50, "moisture" should be -- mixture --

Col. 7, line 7, delete "is"

Col. 8, line 15, "(bis)cyanatophenylene)" should be -- bis(cyanatophenylene) --

Col. 8, line 25-26, "(bis)-cyanatophenylene) should be -- bis(cyanatophenylene)--

Col. 8, line 34, delete "is".

Signed and Sealed this

Twenty-eighth Day of September, 1993

Attest:

BRUCE LEHMAN

Attesting Officer

Commissioner of Patents and Trademarks